United States Patent
Woodman et al.

(10) Patent No.: US 10,516,474 B1
(45) Date of Patent: Dec. 24, 2019

(54) EMBEDDED ENVIRONMENTAL CONTROL AND LIFE SUPPORT SYSTEM USING COMPACT FORM FACTOR

(71) Applicant: Hamilton Sundstrand Corporation, Charlotte, NC (US)

(72) Inventors: Darren Woodman, North Granby, CT (US); Kevin G. Hawes, Tolland, MA (US); Patrick J. Sears, South Hadley, MA (US); Timothy A. Roberts, Enfield, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 16/216,553

(22) Filed: Dec. 11, 2018

(51) Int. Cl.
| *H04B 7/185* | (2006.01) |
| *G06F 13/38* | (2006.01) |
| *H05K 7/14* | (2006.01) |

(52) U.S. Cl.
CPC ....... *H04B 7/18519* (2013.01); *G06F 13/385* (2013.01); *H04B 7/18506* (2013.01); *H05K 7/1412* (2013.01); *G06F 2213/0026* (2013.01)

(58) Field of Classification Search
CPC .................................................. H04B 7/18506
See application file for complete search history.

(56) References Cited

U.S. PATENT DOCUMENTS

| 7,020,076 | B1 | 3/2006 | Alkalai et al. |
| 7,577,482 | B1* | 8/2009 | Steele .................. G05B 19/042 700/19 |
| 8,260,736 | B1 | 9/2012 | Lear et al. |
| 8,369,069 | B2 | 2/2013 | Osternack et al. |
| 9,706,508 | B2 | 7/2017 | Fletcher et al. |
| 2012/0065813 | A1 | 3/2012 | Nguyen et al. |

* cited by examiner

*Primary Examiner* — Keith Ferguson
(74) *Attorney, Agent, or Firm* — Cantor Colburn LLP

(57) ABSTRACT

A peripheral component interconnect (PCI) device is provided for use in an environmental control and life support system (ECLSS). The PCI device includes a control card, mounting slots each of which is receptive of the control card and coupled with a piece of ECLSS equipment and a backplane configured to respectively provide, via communication and power signals, communications and power to the control card in any one of the mounting slots. With the control card received in one of the mounting slots, the control card accommodates multiple power levels, executes commutation logic and executes one or more of active current control and active current modulation in accordance with the one of the mounting slots and the piece of the ECLSS equipment coupled therewith.

20 Claims, 3 Drawing Sheets

EMBEDDED ENVIRONMENTAL CONTROL AND LIFE SUPPORT SYSTEM USING COMPACT FORM FACTOR

BACKGROUND

The following description relates to an environmental control and life support system (ECLSS) and, more particularly, to an embedded ECLSS that uses a compact form factor.

In certain vehicles, such as space vehicles, an ECLSS is responsible for maintaining a livable environment. For a manned satellite, for example, the onboard ECLSS therefore includes multiple motors, actuators, pumps, valves, heaters and other operable equipment that cooperatively control various environmental conditions in the living space. Each piece of equipment can be independently controlled and operated.

As demands for reduced equipment sizes and decreased power requirements become increasingly significant over time, it becomes necessary to handle the independent controls of the ECLSS equipment through a single operational device. Recently, a peripheral component interconnect (PCI) device has been proposed as such as device and typically includes a backplane, a power supply and a card cage. The card cage is designed for mechanical packaging and includes a chassis with multiple slots for mounting cards therein. Various cards can be inserted into the slots for controlling respective pieces of ECLSS equipment. The backplane distributes communication and power signals between the cards mounted in the slots.

In current PCI devices, the cards are not hot-swappable. If one card is found to be non-functional, another card cannot be simply plugged into the slot the non-functional card was plugged into to take its place.

BRIEF DESCRIPTION

According to an aspect of the disclosure, a peripheral component interconnect (PCI) device is provided for use in an environmental control and life support system (ECLSS). The PCI device includes a control card, mounting slots each of which is receptive of the control card and coupled with a piece of ECLSS equipment and a backplane configured to respectively provide, via communication and power signals, communications and power to the control card in any one of the mounting slots. With the control card received in one of the mounting slots, the control card accommodates multiple power levels, executes commutation logic and executes one or more of active current control and active current modulation in accordance with the one of the mounting slots and the piece of the ECLSS equipment coupled therewith.

In accordance with additional or alternative embodiments, the PCI device further includes high and low voltage supply sources, an effector feedback unit and a slot identification unit.

In accordance with additional or alternative embodiments, the PCI device further includes effector elements respectively coupled with a corresponding mounting slot, each of the effector elements being configured to issue a feedback signal to the effector feedback unit and each of the mounting slots includes a power bridge unit, a current sensing unit and a current detection unit comprising a set point unit.

In accordance with additional or alternative embodiments, the control card includes auto-commutation tables, a voltage detection unit communicative with each of the high and low voltage supply sources, a velocity control unit communicative with the effector feedback unit and a current sensing unit coupled with the auto-commutation tables, the voltage detection unit and the velocity control unit and intercommunicative with the power bridge and the current detection units of each of the mounting slots.

In accordance with additional or alternative embodiments, the control card includes an assignment table and a startup control unit comprising a heater control unit, an actuator breakaway unit and a valve actuation unit, the startup control unit being coupled with the assignment table and communicative with the set point unit of each of the mounting slots.

In accordance with additional or alternative embodiments, the control card includes a slot detection unit communicative with the slot identification unit.

In accordance with additional or alternative embodiments, the control card includes a serial communication unit.

In accordance with additional or alternative embodiments, the control card includes auto-commutation tables, a voltage detection unit communicative with each of the high and low voltage supply sources, a velocity control unit communicative with the effector feedback unit, a current sensing unit coupled with the auto-commutation tables, the voltage detection unit and the velocity control unit and intercommunicative with the power bridge and the current detection units of each of the mounting slots, an assignment table, a startup control unit comprising a heater control unit, an actuator breakaway unit and a valve actuation unit, the startup control unit being coupled with the assignment table and communicative with the set point unit of each of the mounting slots, a slot detection unit communicative with the slot identification unit and a serial communication unit.

According to another aspect of the disclosure, a peripheral component interconnect (PCI) device is provided for use in an environmental control and life support system (ECLSS). The PCI device includes high and low voltage supply sources, an effector feedback unit, a slot identification unit, a control card, mounting slots each of which is receptive of the control card, coupled with a piece of ECLSS equipment and comprises a power bridge unit, a current sensing unit and a current detection unit comprising a set point unit, effector elements respectively coupled with a corresponding mounting slot, each of the effector elements being configured to issue a feedback signal to the effector feedback unit and a backplane configured to respectively provide, via communication and power signals, communications and power from one of the high and low voltage supply sources to the control card in any one of the mounting slots. With the control card received in one of the mounting slots, the control card accommodates multiple power levels, executes commutation logic and executes one or more of active current control and active current modulation in accordance with the one of the mounting slots and the piece of the ECLSS equipment coupled therewith.

In accordance with additional or alternative embodiments, the control card includes auto-commutation tables, a voltage detection unit communicative with each of the high and low voltage supply sources, a velocity control unit communicative with the effector feedback unit and a current sensing unit coupled with the auto-commutation tables, the voltage detection unit and the velocity control unit and intercommunicative with the power bridge and the current detection units of each of the mounting slots.

In accordance with additional or alternative embodiments, the control card includes an assignment table and a startup control unit including a heater control unit, an actuator breakaway unit and a valve actuation unit, the startup control unit being coupled with the assignment table and communicative with the set point unit of each of the mounting slots.

In accordance with additional or alternative embodiments, the control card includes a slot detection unit communicative with the slot identification unit.

In accordance with additional or alternative embodiments, the control card includes a serial communication unit.

According to yet another aspect of the disclosure, a control card of a peripheral component interconnect (PCI) device is provided for use in an environmental control and life support system (ECLSS). The control card is receivable in a mounting slot coupled with a piece of ECLSS equipment such that the control card is receptive of communication and power signals. With the control card received in the mounting slot, the control card accommodates multiple power levels, executes commutation logic and executes one or more of active current control and active current modulation in accordance with the mounting slot and the piece of the ECLSS equipment coupled therewith.

In accordance with additional or alternative embodiments, the PCI device includes high and low voltage supply sources, an effector feedback unit and a slot identification unit.

In accordance with additional or alternative embodiments, the mounting slot is provided as one of plural mounting slots, the PCI device further includes effector elements respectively coupled with a corresponding mounting slot, each of the effector elements being configured to issue a feedback signal to the effector feedback unit, and each of the mounting slots includes a power bridge unit, a current sensing unit and a current detection unit comprising a set point unit.

In accordance with additional or alternative embodiments, the control card includes auto-commutation tables, a voltage detection unit communicative with each of the high and low voltage supply sources, a velocity control unit communicative with the effector feedback unit and a current sensing unit coupled with the auto-commutation tables, the voltage detection unit and the velocity control unit and intercommunicative with the power bridge and the current detection units of each of the mounting slots.

In accordance with additional or alternative embodiments, the control card includes an assignment table and a startup control unit including a heater control unit, an actuator breakaway unit and a valve actuation unit, the startup control unit being coupled with the assignment table and communicative with the set point unit of each of the mounting slots.

In accordance with additional or alternative embodiments, the control card includes a slot detection unit communicative with the slot identification unit.

In accordance with additional or alternative embodiments, the control card includes a serial communication unit.

These and other advantages and features will become more apparent from the following description taken in conjunction with the drawings.

BRIEF DESCRIPTION OF THE DRAWINGS

The subject matter, which is regarded as the disclosure, is particularly pointed out and distinctly claimed in the claims at the conclusion of the specification. The foregoing and other features, and advantages of the disclosure are apparent from the following detailed description taken in conjunction with the accompanying drawings in which:

These and other advantages and features will become more apparent from the following description taken in conjunction with the drawings.

DETAILED DESCRIPTION

As will be described below, a PCI device is provided with an on-orbit field programmable gate array (FPGA)-based, configurable and scalable effector control card (hereinafter referred to as a "control card"). The control card is capable of being hot-swapped within the PCI device to control motors and actuators, valves, heaters and various other pieces of ECLSS equipment. The control card accommodates different power levels with a common architecture and card design that can be hot-swapped within the PCI device to provide for fault isolation and mitigation. The control card provides for automatic commutation logic detection for different motors and is compatible within any motor within an associated ECLSS. The control card also provides for FPGA active current control/modulation. The FPGA active current/modulation provides for velocity control with independent current control, startup control with customizable start-up profiles to accommodate high starting torque applications while also reducing maximum achievable power during steady state and fault conditions, actuator breakaway/stall capabilities that allow for high break-away torque while also reducing mechanical stress at hard stops and for custom load torque profiles, valve actuation capabilities that allow for high actuation current while also reducing fault current during hold-in and heater control capabilities that provide for constant power control for power interfaces with wide supply voltage ranges. Besides being able to drive effectors, the control card can also read data and information from resistor temperature detectors (RTD), pressure sensors, various gas sensors and conductivity sensors. The control card can also provide for serial communication capabilities.

Figure 1:
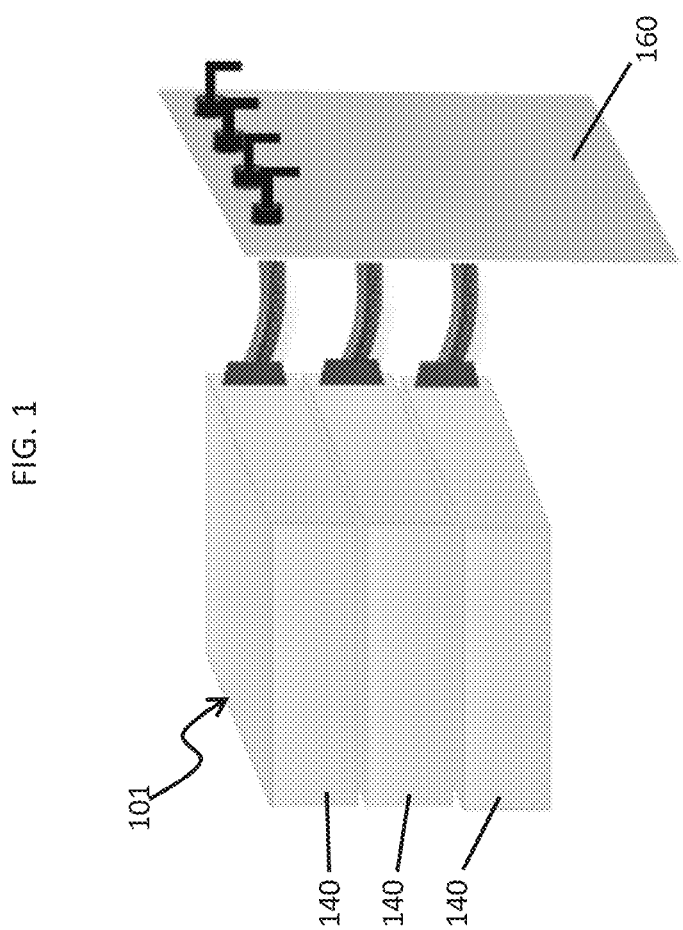
FIG. 1 is a perspective view of a PCI device in accordance with embodiments.
Figure 2:
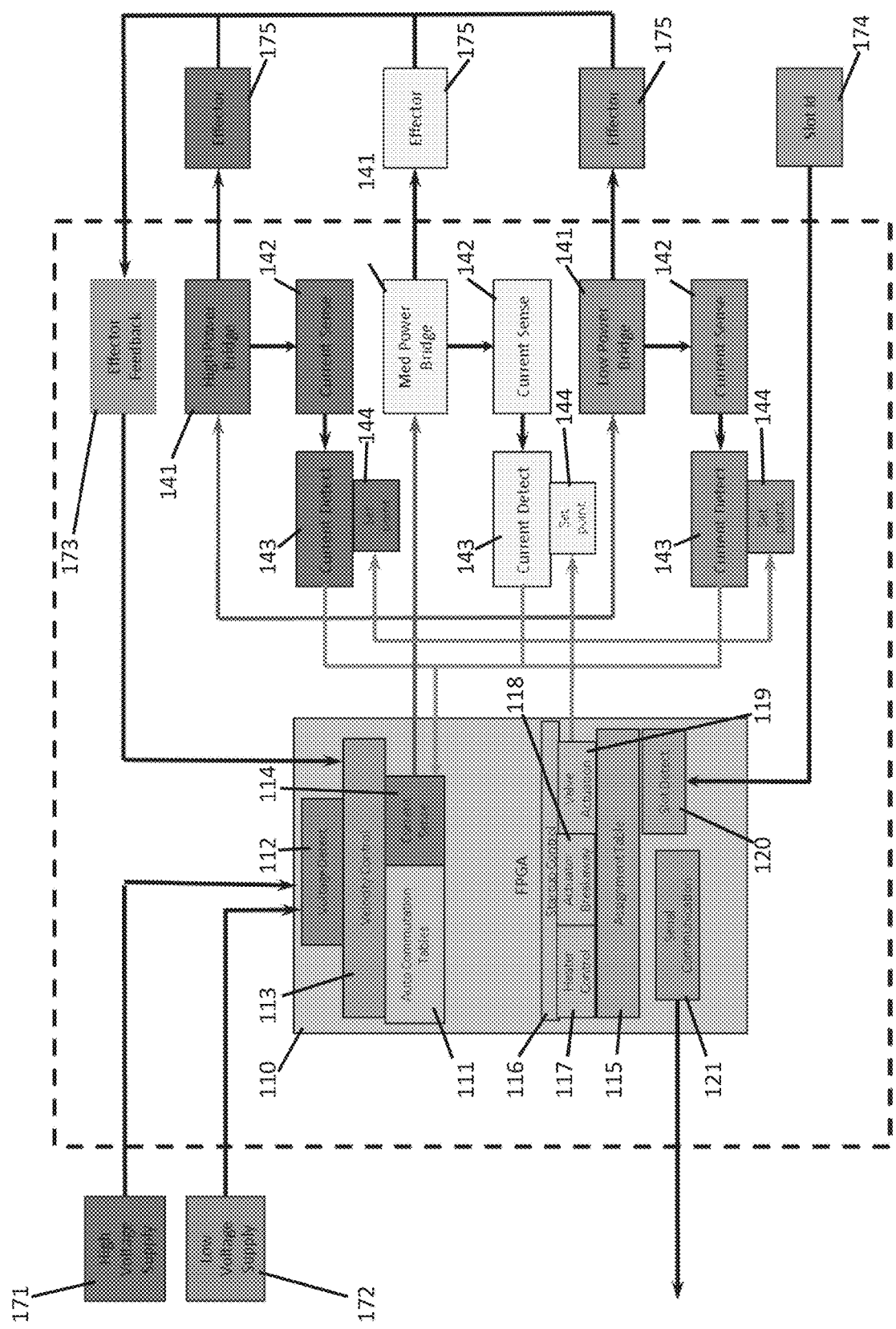
FIG. 2 is a functional block diagram of operational components of the PCI device of FIG. 1.

With reference to FIGS. 1 and 2, a PCI device 101 is provided for use in an environmental control and life support system (ECLSS). The PCI device 101 includes a control card 110, mounting slots 140 that are each receptive of the control card 110 and coupled with a piece of ECLSS equipment and a backplane 160. The backplane 160 is configured to respectively provide, via communication and power signals, communications and power to the control card 110 with the control card 110 received in any one of the mounting slots 140.

With the control card 110 received in one of the mounting slots 140, the control card 110 is configured to accommodate multiple power levels with a common architecture and card design, to execute commutation logic and to execute one or more of active current control and active current modulation in accordance with the one of the mounting slots 140 in which the control card 110 is received and the piece of the ECLSS equipment coupled with the one of the mounting slots 140 in which the control card 110 is received.

The PCI device 101 further includes a high voltage supply source 171 and a low voltage supply source 172, an effector feedback unit 173, a slot identification unit 174 and effector elements 175. The effector elements 175 are respectively coupled with a corresponding mounting slot 140 and thus to a corresponding piece of ECLSS equipment. Each of the effector elements 175 is configured to issue a feedback signal to the effector feedback unit 173. Each of the mounting slots 140 includes one or more of a high, medium and low power bridge unit 141, a current sensing unit 142 and a current detection unit 143 that includes a set point unit 144.

The control card 110 includes auto-commutation tables 111, a voltage detection unit 112 that is communicative with each of the high voltage supply source 171 and the low voltage supply source 172, a velocity control unit 113 that is communicative with the effector feedback unit 173 and a current sensing unit 114 that is coupled with the auto-commutation tables 111, the voltage detection unit 112 and the velocity control unit 113. The current sensing unit 114 is intercommunicative with the power bridge unit 141 and the current detection unit 143 of each of the mounting slots 140.

The control card 110 also includes an assignment table 115 and a startup control unit 116. The startup control unit 116 includes a heater control unit 117, an actuator breakaway unit 118 and a valve actuation unit 119. The startup control unit 116 is coupled with the assignment table 115 and is communicative with the set point unit 144 of each of the mounting slots 140.

The control card 110 also includes a slot detection unit 120 that is communicative with the slot identification unit 174 and a serial communication unit 121.

With the PCI device 101 provided as described above, the control card 110 can be hot-swapped into a mounting slot 140 (i.e., when it is found that a corresponding piece of ECLSS equipment is malfunctioning or non-functional as a way to isolate a fault or to mitigate the effect of a fault). As used herein, hot-swapping refers to the insertion of the control card 110 into the mounting slot 140 without powering down the PCI device 101 as a whole. The mounting slot 140 can be coupled with any one of motors and actuators, valves, heaters and various other pieces of ECLSS equipment which the control card 110 operates by way of the corresponding effector element 175.

Upon insertion into the mounting slot 140, the slot identification unit 174 sends an identification signal to the slot detection unit 120 to indicate to the control card 110 that the control card 110 has been inserted into the mounting slot 140. At this point, the serial communication unit 121 provides for communications with additional devices that can be coupled with the control card 110 such that the additional devices, the control card 110 and the PCI device 101 are serially connected. In addition, at this point, the startup control unit 116 accesses the assignment table 115 and determines what type of ECLSS equipment the mounting slot 140 is coupled with using data of the identification signal.

In an event the ECLSS equipment type is a motor or an actuator, the startup control unit 116 establishes operational set points for the motor or the actuator itself or with input from the actuator breakaway unit 118. The set points are then issued to the set point unit 144. This allows the startup control unit 116 to generate a customizable or agile start-up profile based on active feedback control loop signals to accommodate a high starting torque application for the motor while also reducing maximum applied power during steady state and fault conditions and allow for the calculation of a high break-away torque for the actuator while also reducing mechanical stress at a hard stop of the actuator and for the generation of a custom load torque profile for the actuator.

In an event the ECLSS equipment type is a valve, the startup control unit 116 establishes operational set points for the valve itself or with input from the valve actuation unit 119. The set points are then issued to the set point unit 144. This allows the startup control unit 116 to determine and deploy optimal actuation current for the valve while also reducing fault current during hold-in incidents.

In an event the ECLSS equipment type is a heater, the startup control unit 116 establishes operational set points for the heater itself or with input from the heater control unit 117. The set points are then issued to the set point unit 144. This allows the startup control unit 116 to provide constant power control for power interfaces of the heater with wide supply voltage ranges.

During subsequent operations, the voltage detection unit 112 receives high and low voltage supplies from the high and low voltage supply sources 171 and 172, the velocity control unit 113 receives an effector feedback signal from the effector feedback unit 173 and the current sensing unit 114 receives a detected current feedback signal from the current detection unit 143 of each of the mounting slots 140. The current sensing unit 114 thus issues a current/torque control signal to the power bridge unit 141 of each of the mounting slots 140 in accordance with translations of the high and low voltage supplies, the effector feedback signal and the detected current feedback signal as defined by the auto-commutation tables 111. The issued current/torque control signal is reflective of an automatic commutation logic output. The power bridge unit 141 then instructs the corresponding effector element 175 to operate (i.e., the auto-commutation tables 111 facilitate the determination of a specific firing sequence of motor phases based on sensor feedback) and sends a current signal to the current detection unit 143 by way of the current sensing unit 142.

Figure 3:
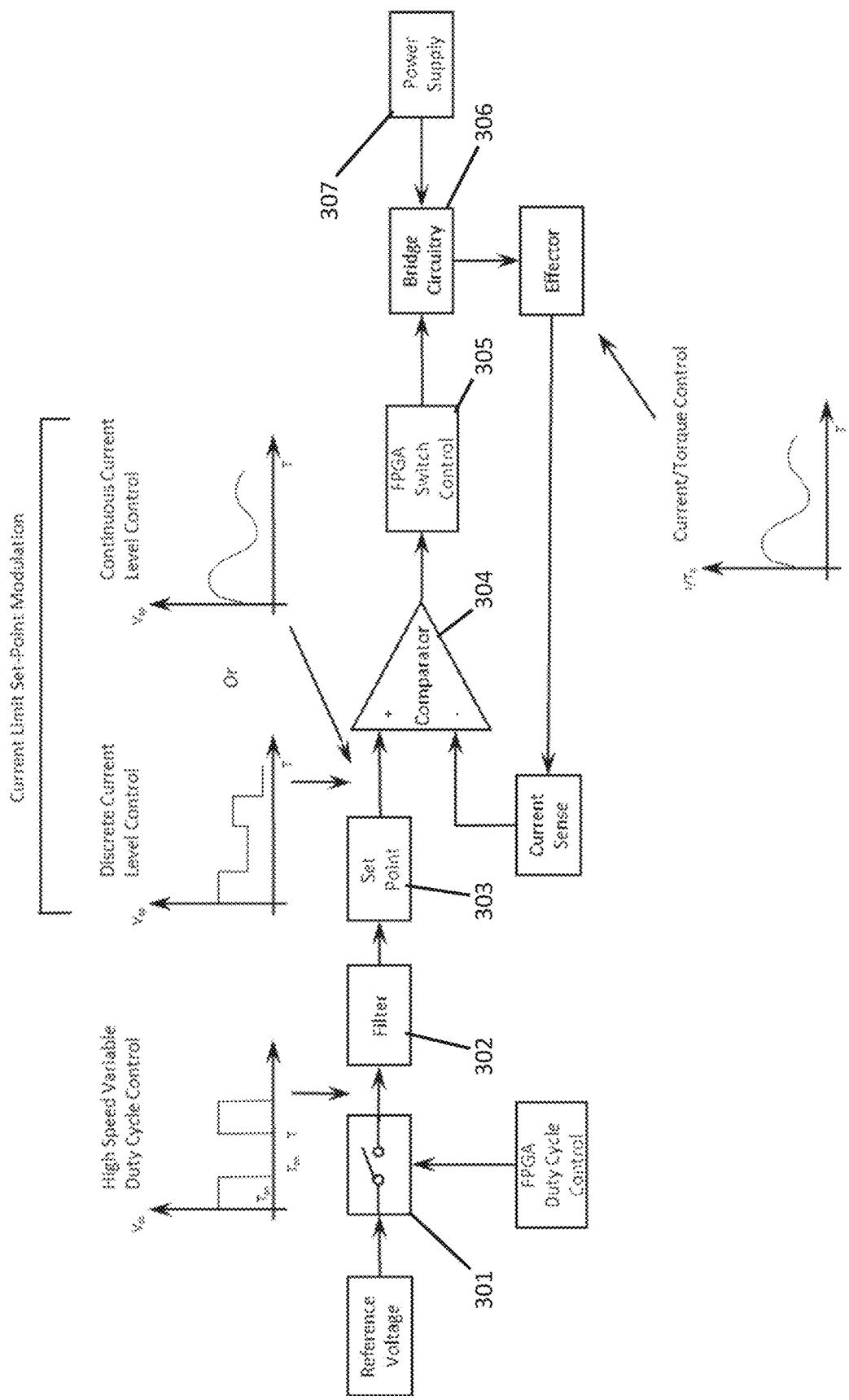
FIG. 3 is a control diagram illustrating an operation of certain operational components of FIG. 2.

With reference to FIG. 3, a method of generating the current/toque control signal that is issued to the effector element 175 of each mounting slot 140 will now be described. As shown in FIG. 3, a reference voltage signal and an FPGA duty cycle control signal are received and combined at a switching element 301. A resulting output of the switching element 301 is combined with a high speed variable duty cycle control signal and provided to a filter element 302 and then to a set point element 303, which establishes set points to be issued to the set point units 144. An output of the set point element 303 is combined with a discrete current level control signal or a continuous current level control signal and provided as one of two inputs to a comparator 304 with the other input being a current sensing signal derived from the effector element 175.

An output of the comparator 304 is provided to an FPGA switch control unit 305 and then to bridge circuitry 306 of the power bridge units 141 along with a power supply 307. An output of the bridge circuitry 306 is provided to the effector element 175 as the current/torque control signal.

Technical effects and benefits of the features described herein are the provision of a centralized system for operating ECLSS equipment that is accessible by a crew and provides for spare function channels in order to isolate or mitigate faults.

While the disclosure is provided in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that the exemplary embodiment(s) may include only some of the described exemplary aspects. Accordingly, the disclosure is not to be seen as limited by the foregoing description, but is only limited by the scope of the appended claims.

What is claimed is:

1. A peripheral component interconnect (PCI) device for use in an environmental control and life support system (ECLSS), the PCI device comprising:
   a control card;
   mounting slots each of which is receptive of the control card and coupled with a piece of ECLSS equipment; and
   a backplane configured to respectively provide, via communication and power signals, communications and power to the control card in any one of the mounting slots,
   wherein, with the control card received in one of the mounting slots, the control card accommodates multiple power levels, executes commutation logic and executes one or more of active current control and active current modulation in accordance with the one of the mounting slots and the piece of the ECLSS equipment coupled therewith.

2. The PCI device according to claim 1, further comprising:
   high and low voltage supply sources;
   an effector feedback unit; and
   a slot identification unit.

3. The PCI device according to claim 2, wherein:
   the PCI device further comprises effector elements respectively coupled with a corresponding mounting slot, each of the effector elements being configured to issue a feedback signal to the effector feedback unit, and
   each of the mounting slots comprises a power bridge unit, a current sensing unit and a current detection unit comprising a set point unit.

4. The PCI device according to claim 3, wherein the control card comprises:
   auto-commutation tables;
   a voltage detection unit communicative with each of the high and low voltage supply sources;
   a velocity control unit communicative with the effector feedback unit; and
   a current sensing unit coupled with the auto-commutation tables, the voltage detection unit and the velocity control unit and intercommunicative with the power bridge and the current detection units of each of the mounting slots.

5. The PCI device according to claim 3, wherein the control card comprises:
   an assignment table; and
   a startup control unit comprising a heater control unit, an actuator breakaway unit and a valve actuation unit, the startup control unit being coupled with the assignment table and communicative with the set point unit of each of the mounting slots.

6. The PCI device according to claim 3, wherein the control card comprises a slot detection unit communicative with the slot identification unit.

7. The PCI device according to claim 3, wherein the control card comprises a serial communication unit.

8. The PCI device according to claim 3, wherein the control card comprises:
   auto-commutation tables;
   a voltage detection unit communicative with each of the high and low voltage supply sources;
   a velocity control unit communicative with the effector feedback unit;
   a current sensing unit coupled with the auto-commutation tables, the voltage detection unit and the velocity control unit and intercommunicative with the power bridge and the current detection units of each of the mounting slots;
   an assignment table;
   a startup control unit comprising a heater control unit, an actuator breakaway unit and a valve actuation unit, the startup control unit being coupled with the assignment table and communicative with the set point unit of each of the mounting slots;
   a slot detection unit communicative with the slot identification unit; and
   a serial communication unit.

9. A peripheral component interconnect (PCI) device for use in an environmental control and life support system (ECLSS), the PCI device comprising:
   high and low voltage supply sources;
   an effector feedback unit;
   a slot identification unit;
   a control card;
   mounting slots each of which is receptive of the control card, coupled with a piece of ECLSS equipment and comprises a power bridge unit, a current sensing unit and a current detection unit comprising a set point unit;
   effector elements respectively coupled with a corresponding mounting slot, each of the effector elements being configured to issue a feedback signal to the effector feedback unit; and
   a backplane configured to respectively provide, via communication and power signals, communications and power from one of the high and low voltage supply sources to the control card in any one of the mounting slots,
   wherein, with the control card received in one of the mounting slots, the control card accommodates multiple power levels, executes commutation logic and executes one or more of active current control and active current modulation in accordance with the one of the mounting slots and the piece of the ECLSS equipment coupled therewith.

10. The PCI device according to claim 9, wherein the control card comprises:
    auto-commutation tables;
    a voltage detection unit communicative with each of the high and low voltage supply sources;
    a velocity control unit communicative with the effector feedback unit; and
    a current sensing unit coupled with the auto-commutation tables, the voltage detection unit and the velocity control unit and intercommunicative with the power bridge and the current detection units of each of the mounting slots.

11. The PCI device according to claim 9, wherein the control card comprises:
    an assignment table; and
    a startup control unit comprising a heater control unit, an actuator breakaway unit and a valve actuation unit, the startup control unit being coupled with the assignment table and communicative with the set point unit of each of the mounting slots.

12. The PCI device according to claim 9, wherein the control card comprises a slot detection unit communicative with the slot identification unit.

13. The PCI device according to claim 9, wherein the control card comprises a serial communication unit.

14. A control card of a peripheral component interconnect (PCI) device for use in an environmental control and life support system (ECLSS), the control card being receivable in a mounting slot coupled with a piece of ECLSS equipment such that the control card is receptive of communication and power signals, and, with the control card received in the mounting slot, the control card accommodates multiple power levels, executes commutation logic and executes one or more of active current control and active current modulation in accordance with the mounting slot and the piece of the ECLSS equipment coupled therewith.

15. The control card according to claim 14, wherein the PCI device comprises:

high and low voltage supply sources;
an effector feedback unit; and
a slot identification unit.

16. The control card according to claim 15, wherein:

the mounting slot is provided as one of plural mounting slots, the PCI device further comprises effector elements respectively coupled with a corresponding mounting slot, each of the effector elements being configured to issue a feedback signal to the effector feedback unit, and each of the mounting slots comprises a power bridge unit, a current sensing unit and a current detection unit comprising a set point unit.

17. The control card according to claim 16, wherein the control card comprises:

auto-commutation tables;
a voltage detection unit communicative with each of the high and low voltage supply sources;
a velocity control unit communicative with the effector feedback unit; and
a current sensing unit coupled with the auto-commutation tables, the voltage detection unit and the velocity control unit and intercommunicative with the power bridge and the current detection units of each of the mounting slots.

18. The control card according to claim 16, wherein the control card comprises:

an assignment table; and
a startup control unit comprising a heater control unit, an actuator breakaway unit and a valve actuation unit, the startup control unit being coupled with the assignment table and communicative with the set point unit of each of the mounting slots.

19. The control card according to claim 16, wherein the control card comprises a slot detection unit communicative with the slot identification unit.

20. The control card according to claim 16, wherein the control card comprises a serial communication unit.

* * * * *